(12) United States Patent
Jun et al.

(10) Patent No.: US 8,154,197 B2
(45) Date of Patent: Apr. 10, 2012

(54) ORGANIC LIGHT EMITTING DIODE DISPLAY DEVICE HAVING REFRACTION LAYERS THAT IMPROVE LIGHT EXTRACTION EFFICIENCY AND COLOR REPRODUCIBILITY

(75) Inventors: Hyuk-Sang Jun, Yongin (KR); Ok-Keun Song, Yongin (KR); Hye-In Jeong, Yongin (KR); Young-Mo Koo, Yongin (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 214 days.

(21) Appl. No.: 12/477,705

(22) Filed: Jun. 3, 2009

(65) Prior Publication Data
US 2009/0302750 A1 Dec. 10, 2009

(30) Foreign Application Priority Data
Jun. 5, 2008 (KR) ........................ 10-2008-0053339

(51) Int. Cl.
*H01J 1/62* (2006.01)
*H01J 63/04* (2006.01)
(52) U.S. Cl. ........................ 313/504; 313/512
(58) Field of Classification Search .................. 313/504, 313/506, 512, 113; 428/690; 257/98
See application file for complete search history.

(56) References Cited

U.S. PATENT DOCUMENTS

| | | | |
|---|---|---|---|
| 5,780,174 A * | 7/1998 | Tokito et al. .................. | 428/690 |
| 5,814,416 A * | 9/1998 | Dodabalapur et al. ........ | 428/690 |
| 6,791,261 B1 | 9/2004 | Shimoda et al. | |
| 2004/0022513 A1* | 2/2004 | Hryniewicz et al. .......... | 385/131 |
| 2004/0232833 A1* | 11/2004 | Menda et al. .................. | 313/512 |
| 2005/0040410 A1* | 2/2005 | Ledentsov et al. ............. | 257/79 |
| 2005/0051791 A1 | 3/2005 | Gotoh et al. | |
| 2005/0161665 A1 | 7/2005 | Winters et al. | |
| 2005/0212407 A1 | 9/2005 | Matsusue | |
| 2006/0097264 A1* | 5/2006 | Kim et al. ....................... | 257/72 |

(Continued)

FOREIGN PATENT DOCUMENTS

CN 1498427 5/2004

(Continued)

OTHER PUBLICATIONS

Certificate of Patent dated Apr. 12, 2010 in corresponding Korean Patent Application No. 10-2006-0053339.

(Continued)

*Primary Examiner* — Nimeshkumar Patel
*Assistant Examiner* — Glenn Zimmerman
(74) *Attorney, Agent, or Firm* — Robert E. Bushnell, Esq.

(57) ABSTRACT

Provided is an organic light emitting diode display device which can improve brightness and color coordinate characteristics in all emission wavelength ranges, and thus can enhance light extraction efficiency and color reproducibility. The organic light emitting diode display device includes a substrate, a first electrode disposed on the substrate, an organic layer disposed on the first electrode and having an emission layer, a second electrode disposed on the organic layer, and first and second refraction layers. A stack of the first and second refraction layers is disposed either between the first electrode and the substrate or on the second electrode. A refractive index of the first refraction layer is smaller than a refractive index of the second refraction layer. A thickness of the first refraction layer is no greater than 100 nm.

23 Claims, 4 Drawing Sheets

U.S. PATENT DOCUMENTS

| | | | |
|---|---|---|---|
| 2006/0108919 A1* | 5/2006 | Kobayashi | 313/506 |
| 2007/0132381 A1* | 6/2007 | Hayashi et al. | 313/512 |

FOREIGN PATENT DOCUMENTS

| | | |
|---|---|---|
| CN | 1728413 | 2/2006 |
| CN | 1305161 | 7/2006 |
| CN | 1805161 | 7/2006 |
| EP | 1480281 A2 | 11/2004 |
| EP | 1657764 A1 | 5/2006 |
| JP | 63-314795 | 12/1988 |
| JP | 06-275381 A | 9/1994 |
| JP | 07-130471 | 5/1995 |
| JP | 08-213174 | 8/1996 |
| JP | 08-250786 | 9/1996 |
| JP | 09-180883 A | 7/1997 |
| JP | 10-177896 | 6/1998 |
| JP | 2003031374 | 1/2003 |
| JP | 2003077680 | 3/2003 |
| JP | 2003-528421 A | 9/2003 |
| JP | 2004-253390 A | 9/2004 |
| JP | 2004-361662 A | 12/2004 |
| JP | 2004349111 | 12/2004 |
| JP | 2006-092899 | 4/2006 |
| JP | 2006-173114 A | 6/2006 |
| JP | 2007-052971 A | 3/2007 |
| JP | 2007-053115 A | 3/2007 |
| JP | 2007-106930 A | 4/2007 |
| JP | 2007-272156 A | 10/2007 |
| KR | 10-2005-0026845 | 3/2005 |
| KR | 10-2005-0042705 | 5/2005 |
| KR | 1020060056849 A | 5/2006 |
| KR | 10-2007-0049248 A | 5/2007 |
| KR | 10-2007-0065647 | 6/2007 |
| WO | 2004023614 | 3/2004 |
| WO | 2004/077519 A2 | 9/2004 |

OTHER PUBLICATIONS

Chinese Office Action dated Apr. 26, 2010, in corresponding Chinese Patent Application No. 2009101457530.

Transmitter Letter and Korean Office Action issued by Korean Patent Office on Aug. 28, 2009 in the corresponding Korean Application No. 10-2008-0053339.

European Search report issued by European Patent office on Sep. 29, 2009 in the corresponding European Patent Application No. 09251503.0.

* cited by examiner

FIG. 6

ORGANIC LIGHT EMITTING DIODE DISPLAY DEVICE HAVING REFRACTION LAYERS THAT IMPROVE LIGHT EXTRACTION EFFICIENCY AND COLOR REPRODUCIBILITY

CLAIM OF PRIORITY

This application makes reference to, incorporates the same herein, and claims all benefits accruing under 35 U.S.C. §119 from an application earlier filed in the Korean Intellectual Property Office on 5 Jun. 2008 and there duly assigned Serial No. 10-2008-0053339.

BACKGROUND OF THE INVENTION

1. Field of the Invention

The present invention relates to an organic light emitting diode (OLED) display device, and more particularly, to an OLED display device which can improve brightness and color coordinate characteristics in all emission wavelength ranges using a simple structure and process and thus enhance light extraction efficiency and color reproducibility, by controlling thicknesses of first and second refraction layers disposed between an electrode and a transparent substrate.

2. Description of the Related Art

Light efficiency for light emitting devices, particularly flat panel display devices such as OLED display devices, is classified into internal efficiency and external efficiency. The internal efficiency depends on photoelectric conversion efficiency of an organic light emitting material. In addition, the external efficiency, called light extraction efficiency, depends on a refractive index of each layer constituting an organic light emitting diode. The organic light emitting diode exhibits relatively lower light extraction efficiency, i.e., the external efficiency than other display devices such as cathode-ray tubes or PDPs, and thus there is much room for improvement in characteristics of the display device such as brightness, life span, etc.

The biggest reason that the conventional organic light emitting diode has a lower light extraction efficiency than other display devices is because total reflection occurs at an interface between an ITO electrode layer having a high refraction index and a substrate having a low refraction layer when light is emitted through the organic layer at more than a critical angle, thus preventing extraction of the light. Therefore, due to the total reflection at the interface in the organic light emitting diode, only about a quarter of the light actually generated from an organic emission layer can be extracted outside.

An example of a conventional OLED display device for preventing a decrease in light extraction efficiency is disclosed in Japanese Patent Publication No. 63-314795. The OLED display device includes a substrate having a projecting lens. However, because a single pixel has a very small area, it is difficult to form the projecting lens for collecting light on the substrate.

To solve this problem of the OLED display device, an OLED display device having an optical microcavity is disclosed in Japanese Patent Application Laid-open Nos. 8-250786, 8-213174 and 10-177896. The OLED display device has a multi-layered semi-transparent mirror formed between a glass substrate and an ITO electrode, and the semi-transparent mirror serves as an optical resonator together with a metal cathode also serving as a reflective plate. Here, the semi-transparent mirror has a multi-layered structure by alternately stacking a $TiO_2$ layer having a high refractive index and a $SiO_2$ layer having a low refractive index, and an optical resonance is achieved by controlling reflections between the layers. However, such an optical resonator requires as many layers for the semi-transparent mirror as possible to improve refraction characteristics, and the number of layers and thickness of each of the layers have to be accurately optimized to control the reflection at a specific wavelength. For this reason, a process for fabricating the OLED display device may become complicated.

SUMMARY OF THE INVENTION

Aspects of the present invention provide an organic light emitting diode (OLED) display device which can improve brightness and color coordinate characteristics in all emission wavelength ranges using a simple structure and process and thus enhance light extraction efficiency and color reproducibility.

According to an embodiment of the present invention, an OLED display device includes a substrate, a first electrode disposed on the substrate, an organic layer disposed on the first electrode and including an emission layer, a second electrode disposed on the organic layer, and a first and a second refraction layers. A stack of the first and second refraction layers is disposed either between the first electrode and the substrate or on the second electrode. A refractive index of the first refraction layer is smaller than a refractive index of the second refraction layer. A thickness of the first refraction layer is no greater than 100 nm.

The first electrode may be a transmissive electrode, and the second electrode may be a reflective electrode. In this case, the first refraction layer is disposed between the first electrode and the substrate, and the second refraction layer is disposed between the first refraction layer and the substrate.

The first electrode may be a reflective electrode, and the second electrode may be a transmissive electrode. In this case, the first refraction layer is disposed on the second electrode, and the second refraction layer is disposed on the first refraction layer.

According to another embodiment of the present invention, an OLED display device includes a substrate including a plurality of unit pixel regions, a plurality of organic light emitting diodes disposed on the unit pixel regions of the substrate, and a first and a second refraction layers. Each of the organic light emitting diodes includes a first electrode, a second electrode, and an organic layer disposed between the first and the second electrodes. The organic layer has an emission layer. A stack of the first and second refraction layers is disposed either between the first electrode of each of the organic light emitting diodes and the substrate or on the second electrode of each of the organic light emitting diodes. A refractive index of the first refraction layer is smaller than a refractive index of the second refraction layer. A thickness of the first refraction layer is no greater than 100 nm.

Additional aspects and/or advantages of the invention will be set forth in part in the description which follows and, in part, will be obvious from the description, or may be learned by practice of the invention.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 1:
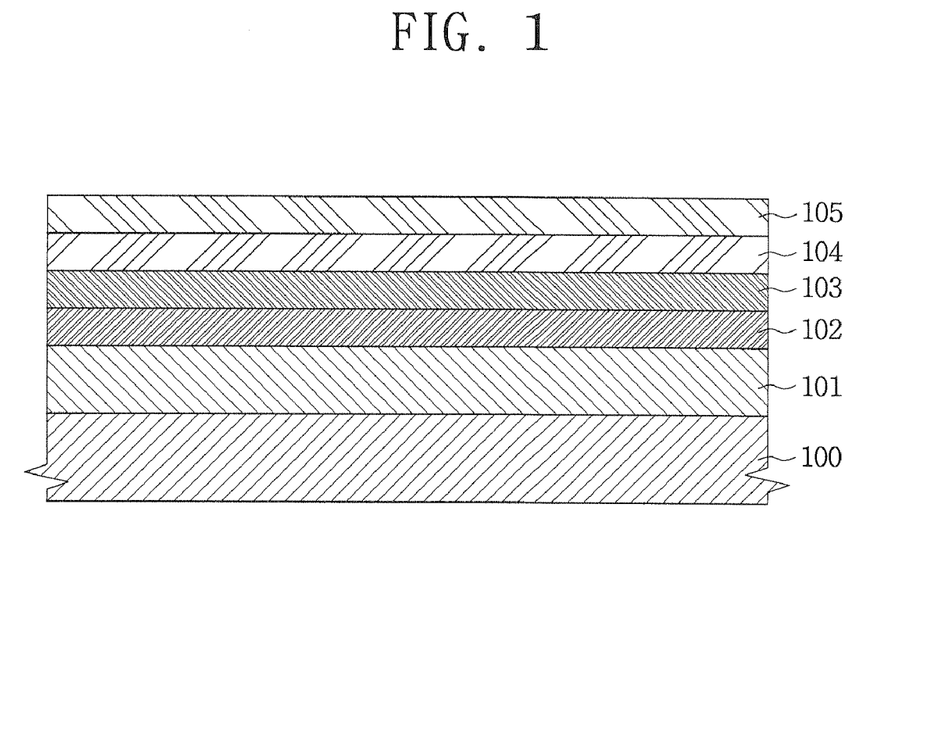
FIG. 1 is a cross-sectional view of an organic light emitting diode (OLED) display device according to a first exemplary embodiment of the present invention.

FIG. 1 is a cross-sectional view of an organic light emitting diode (OLED) display device according to a first exemplary embodiment of the present invention. In the present embodiment, the OLED display device is a bottom-emitting OLED display device which emits light toward a substrate.

Referring to FIG. 1, a substrate 100, a second refraction layer 101, and a first refraction layer 102 are sequentially disposed, and an organic light emitting diode including a first electrode 103, an organic layer 104 having an emission layer, and a second electrode 105 are disposed on the first refraction layer 102. A sealing member (not illustrated) may be further included over the second electrode 105.

The substrate 100 is formed of a light-penetrating material. The substrate 100 may be formed of transparent glass, or transparent polymer material, e.g., polymethylmethacrylate (PMMA), polyaniline (PANI) or polyethylene terephthalate (PET).

An amount of light emitted from the emission layer of the organic layer 104 is reflected at surfaces of the second refraction layer 101, the first refraction layer 102, and the second electrode 105. Reflection between surfaces of these layers induces optical resonance. Due to the optical resonance, the intensity of the light generated from the emission layer is amplified through the optical resonance. The amplified light transmits out of the display device, and thus light extraction efficiency improves.

In the present embodiment, a refractive index n1 of the first refraction layer 102 is smaller than a refractive index n2 of the second refraction layer 101. The first refraction layer 102 is formed not exceeding 100 nm. If the thickness of the first refraction layer 102 is greater than 100 nm, there is almost no significant difference in light extraction efficiency and color reproducibility according to the change in thickness of the first refraction layer 102. Moreover, if the first refraction layer 102 is thicker, it absorbs the light emitted from the emission layer, which can have an adverse effect on light extraction. Accordingly, the first refraction layer 102 is preferably formed not exceeding 100 nm. The first refractive layer 102 also protects the second refraction layer 101 disposed under the first refractive layer 102 during patterning of the first electrode 103.

When the thickness of the first refraction layer 102 is 100 nm or less, the second refraction layer 101 may be formed to a thickness not exceeding 350 nm. When the second refraction layer 101 has a thickness greater than 350 nm, the absorption of light in the second refraction layer 101 may increase. Preferably, the second refraction layer 101 may be formed to a thickness of 20 nm to 100 nm, or 150 nm to 350 nm, and more particularly, 50 nm to 80 nm or 180 nm to 200 nm. In this range, the light extraction efficiency and the color reproducibility can be significantly increased as compared with other thickness ranges. In wavelengths ranging from about 400 nm to 800 nm, which includes wavelengths for red, green and blue colors, the light extraction efficiency and the color reproducibility increase even when the first and second refraction layers 102 and 101 are formed to have the same thickness.

The first and second refraction layers 102 and 101 are formed of a transparent material. Specifically, the first and second refraction layers 102 and 101 may be formed of niobium oxide ($Nb_2O_5$), tantalum oxide ($Ta_2O_5$), titanium oxide ($Ti_2O_5$), silicon nitride (SixNy), silicon oxide ($SiO_2$), antimony oxide ($Sb_2O_3$), aluminum oxide ($Al_2O_3$), zirconium oxide ($ZrO_2$), magnesium oxide (MgO), hafnium dioxide ($HfO_2$) or synthetic polymer. The materials are selectively mixed to make the refractive index n1 of the first refraction layer 102 smaller than the refractive index n2 of the second refraction layer 101. Here, the materials for the first and second refraction layers 102 and 101 can be selected to have n1 ranging from 1.4 to less than 1.8 and to have n2 be 1.1 times of n1. In addition, n1 may be less than a refractive index of the first electrode 103.

The first and second refraction layers 102 and 101 may be formed by a sol-gel, spin coating, spraying, roll coating, ion beam deposition, electron beam deposition, laser ablation, chemical vapor deposition (CVD) or sputtering method, and preferably by a sputtering method to ensure uniformity and stability in forming a large-sized layer.

Meanwhile, a third refraction layer, which is the same layer as the first refraction layer 102, may be further disposed between the second refraction layer 101 and the substrate 100. Alternatively, a stacked structure of the first and second refraction layers 102 and 101 or a stacked structure of the first refraction layer 102, the second refraction layer 101 and the third refraction layer may be repeatedly formed.

Subsequently, the first electrode 103 is disposed on the first refractive layer 102, and serves as a transmissive electrode, through which light is emitted. The first electrode 103 may function as an anode, and may be formed of indium tin oxide (ITO), indium zinc oxide (IZO), tin oxide (TO), zinc oxide (ZnO) or a transparent conductive material. Alternatively, the first electrode 103 may function as a cathode, and may be formed as a thin layer through which light can pass. For example, the first electrode 103 can be made of a material such as conductive metals having a low work function, e.g., magnesium (Mg), calcium (Ca), aluminum (Al), silver (Ag) or an alloy thereof.

The organic layer 104 includes an emission layer, and may further include at least one selected from a hole injection layer, a hole transport layer, an electrode injection layer, an electrode transport layer, a hole blocking layer and an electron blocking layer.

The material for forming the emission layer is not particularly limited, and it may be formed of any material selected from well-known host and dopant materials.

The host material includes 4,4'-N,N'-dicarbazole-biphenyl (CBP), bis-(2-methyl-8-quinolinato)-4-phenylphenolate aluminum (BAlq), 2,9-dimethyl-4,7-diphenyl-1,10-phenanthroline (BCP), N,N'-dicarbazolyl-1,4-dimethene-benzene (DCB), rubrene, and 9,10-bis(2-naphthyl)antracene (AND). The dopant material includes 4,4'-bis(2,2'-diphenylvinyl)-1,1'-biphenyl (DPVBi), distyrylamine derivatives, pyrene derivatives, perylene derivatives, distyrylbiphenyl (DSBP) derivatives, 10-(1,3-benzothiazole-2-yl)-1,1,7,7-tetramethyl-2,3,6,7-tetrahydro-1H,5H,11H-pyrano(2,3-f)pyrido(3,2,1-ij)quinoline-11-one (C545T), quinacridone derivatives, tris(2-phenylpyridine)iridium ($Ir(PPy)_3$), PQIr, $Btp_2Ir(acac)$, 4-(dicyanomethlylene)-2-tert-buthyl-6-(1,1,7,7-tetramethyl-julorydyl-9-enyl)-4H-pyrane (DCJTB), 4-(dicyanomethylene)-2-methyl-6-(p-dimethylaminostyryl)-4H-pyrane (DCM), 2,3,7,8,12,13,17,18-oxtaethyl-21H,23H-porphirne-platinum complex (PtOEP), $Ir(piq)_2(acac)$, RD3(Kodak) and EK8(Kodak).

The hole injection layer may be formed of 4,4',4''-tris(3-methylphenylamino)triphenylamino (m-MTDATA), 1,3,5-trus[4-(3-methylphenylamino)phenyl]benzene (m-MTDATB), copper phthalocyanine (CuPc) or N,N'-di(4-(N,N'-diphenyl-amino)phenyl)-N,N'-diphenylbenzine (DNTPD), and the hole transport layer may be formed of N,N'-diphenyl-N,N'-bis(3-methylphenyl)-1,1'-biphenyl-4,4'-diamine (TPD), N,N'-di(naphthalene-1-yl)-N,N'-diphenyl benzidine (α-NPD), or 4,4'-bis(1-naphthylphenylamino)biphenyl (NPB).

The electron blocking layer may be formed of BAlq, BCP, CF-X, 3-(4-t-butylphenyl)-4-phenyl-5-(4-biphenyl)-1,2,4-triazole (TAZ) or spiro-TAZ, and the hole blocking layer 160 may be formed of 2-(4-biphenyl)-5-(4-tert-butylphenyl)-1,3,4-oxydiazole (PBD), spiro-PBD or TAZ.

The electron transport layer may be formed of TAZ, PBD, spiro-PBD, $Alq_3$, BAlq or SAlq, and the electron injection layer may be formed of LiF, a Ga complex, Liq or CsF.

The organic layer 104 may be formed by thermal vacuum deposition, vapor deposition, spin coating, dip coating, doctor blading, inkjet printing or laser induced thermal imaging.

The second electrode 105 is formed as a reflective layer. The second electrode 105 may function as a cathode, and may be formed as a thick layer to reflect light. The second electrode 105 may be formed of one material selected from the group consisting of conductive metals having a low work function, e.g., Mg, Ca, Al, Ag and an alloy thereof. Alternatively, the second electrode 105 may function as an anode, and may have a stacked structure having a reflective layer, which is formed of Ag, Al, chromium (Cr), Molybdenum (Mo), tungsten (W), titanium (Ti), gold (Au), palladium (Pd) or an alloy thereof, and a transparent layer, which is formed of ITO, IZO, TO or ZnO on the reflective layer.

Figure 2:
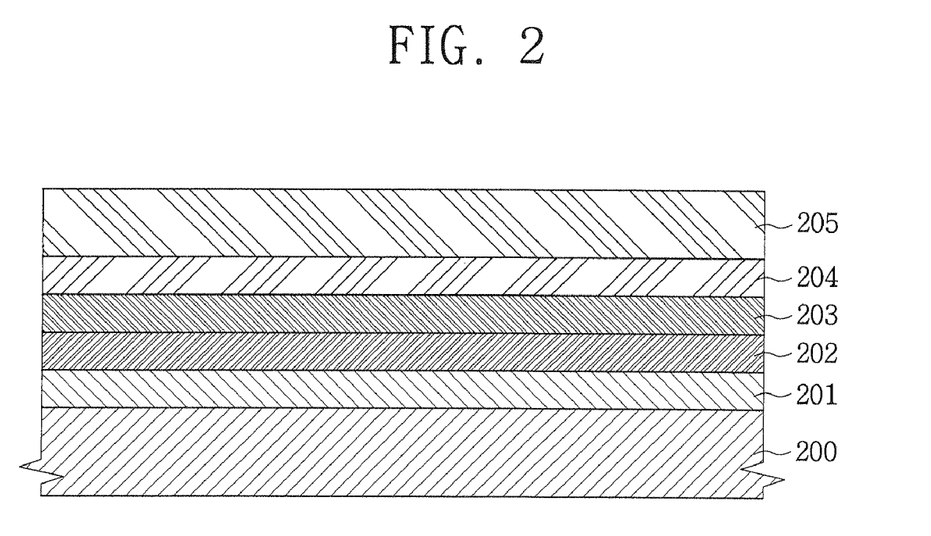
FIG. 2 is a cross-sectional view of an OLED display device according to a second exemplary embodiment of the present invention.

FIG. 2 is a cross-sectional view of an OLED display device according to a second exemplary embodiment of the present invention. The OLED display device is a top-emitting device, unlike the first exemplary embodiment. Except particular descriptions below, descriptions of the display device of the second exemplary embodiment will refer to those of the first exemplary embodiment.

Referring to FIG. 2, a first electrode 201 is disposed on a substrate 200. The first electrode 201 is formed as a reflective electrode. An organic layer 202 having an emission layer is disposed on the first electrode 201. A second electrode 203 is disposed on the organic layer 202. The second electrode 203 is formed as a transmissive electrode.

In the present embodiment, since light is emitted through the second electrode 203, a first refraction layer 204 is disposed on the second electrode 203, and a second refraction layer 205 is disposed on the first refraction layer 204. Like the first embodiment, a refractive index n1 of the first refraction layer 204 is smaller than a refractive index n2 of the second refraction layer 205, and the first refraction layer 204 is formed to a thickness not exceeding 100 nm. Meanwhile, the second refraction layer 205 may be formed to a thickness not exceeding 350 nm, preferably 20 nm to 100 nm or 150 nm to 350 nm, and more preferably 50 nm to 80 nm or 180 nm to 200 nm.

Figure 3:
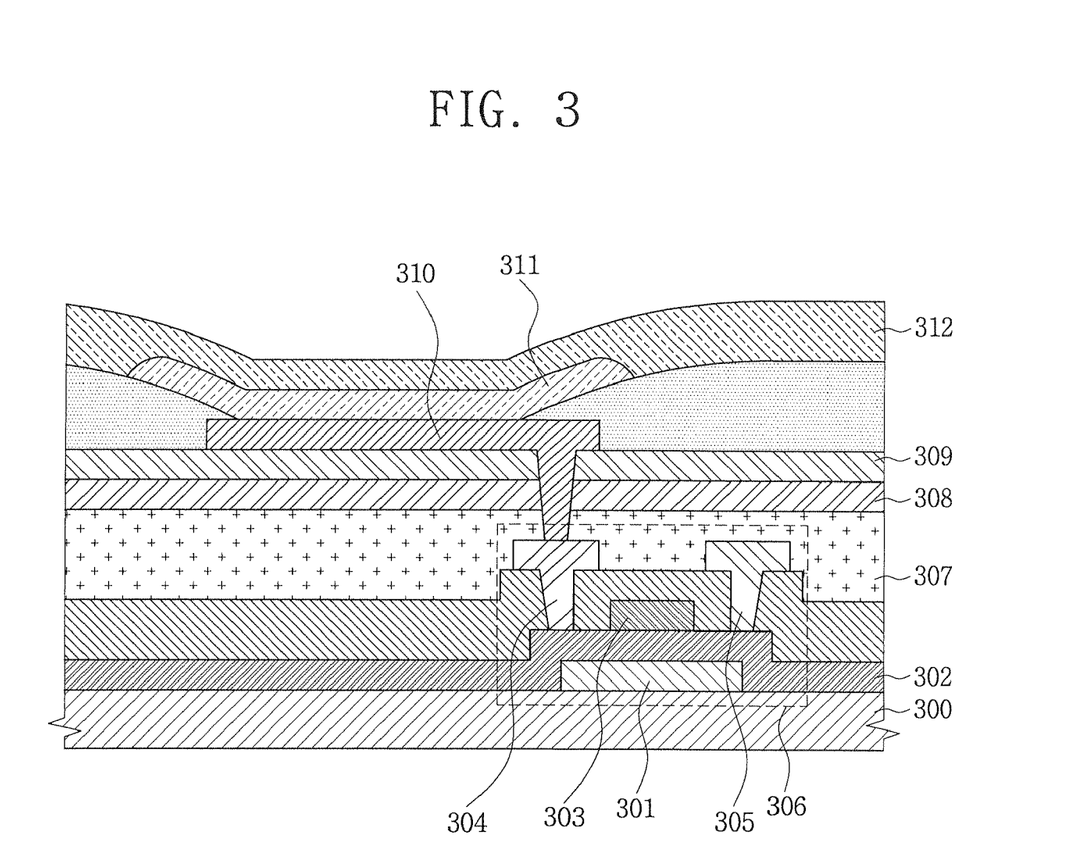
FIG. 3 s a cross-sectional view of an OLED display device according to a third exemplary embodiment of the present invention.

FIG. 3 is a cross-sectional view of an OLED display device according to a third exemplary embodiment of the present invention. The OLED display device is an active matrix OLED display device including a thin film transistor electrically connected to a first electrode formed on a substrate, and is a bottom-emitting device. Except particular descriptions below, descriptions of the OLED display device of the third exemplary embodiment will refer to those of the first and second exemplary embodiments.

Referring to FIG. 3, a thin film transistor 306 including a semiconductor layer 301, a gate insulating layer 302, a gate electrode 303, and source and drain electrodes 304 and 305 is disposed on a substrate 300. A passivation layer 307 may be disposed on the source and drain electrodes 304 and 305.

A second refraction layer 308 is disposed on the passivation layer 307, and a first refraction layer 309 is disposed on the second refraction layer 308.

A first electrode 310 is disposed on the first refraction layer 309, and electrically connected to one of the source and drain electrodes 304 and 305 of the thin film transistor 306. The first electrode 310 is formed as a transmissive electrode.

An organic layer 311 having an emission layer is disposed on the first electrode 310, and a second electrode 312 is disposed on the organic layer 311. The second electrode 312 is formed as a reflective electrode.

Meanwhile, in the top-emitting active-matrix OLED display device, the first electrode 310 is formed as a reflective electrode, and the second electrode 312 is formed as a transmissive electrode. The first refraction layer 309 is disposed over the second electrode 312, and the second refraction layer 308 is disposed on the first refraction layer 309. Alternatively, the first and second refraction layers 309 and the 308 may be disposed between the gate insulating layer 302 and the substrate 300.

Figure 4:
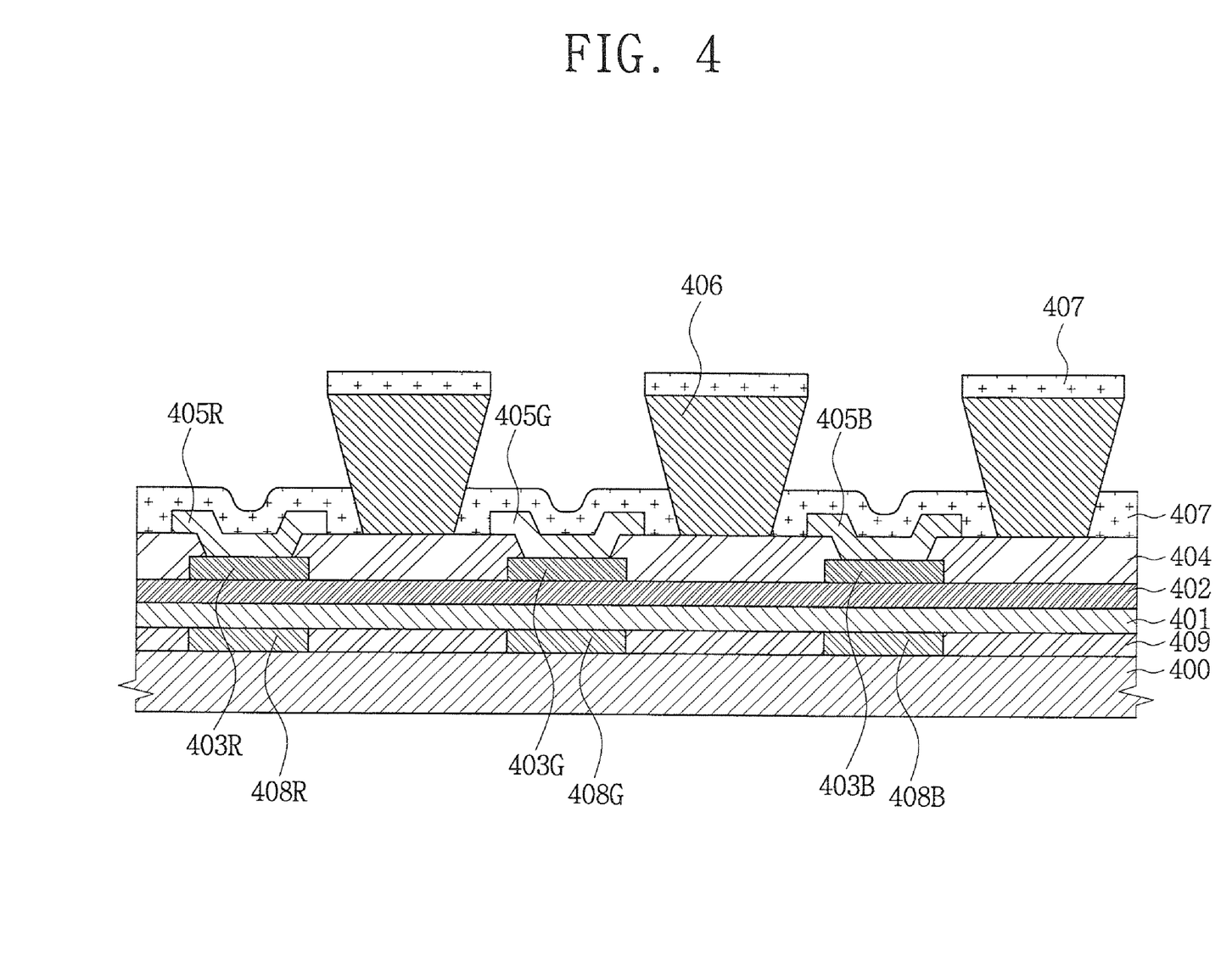
FIG. 4 is a cross-sectional view of an OLED display device according to a fourth exemplary embodiment of the present invention.

FIG. 4 is a cross-sectional view of an OLED display device according to a fourth exemplary embodiment of the present invention. The OLED display device is a full-color OLED display device having red, green and blue pixels, and is a bottom-emitting type. Except particular descriptions below, descriptions of the OLED display device will refer to those of the above embodiments.

Referring to FIG. 4, a substrate 400 having red (R), green (G) and blue (B) unit pixel regions is disposed. A second refraction layer 401 is disposed on the substrate 400, and a first refraction layer 402 is disposed on the second refraction layer 401. Like the above embodiments, a refractive index n1 of the first refraction layer 402 is lower than a refractive index n2 of the second refraction layer 401, and the first refraction layer 402 is formed to a thickness greater than 0 and not exceeding 100 nm. Meanwhile, the second refraction layer 401 may be formed to a thickness greater than 0 and not exceeding 350 nm, preferably, 20 nm to 100 nm or 150 nm to 350 nm, and more preferably 50 nm to 80 nm or 180 nm to 200 nm. In this range, light extraction efficiency and color reproducibility can be significantly increased as compared with other thickness ranges, and can also be increased even when the first and second refraction layers 402 and 401 have the same thickness in a wavelength range of red, green and blue light, which is a wavelength ranging from about 400 to 800 nm. Therefore, the first and second refraction layers 402 and 401 do not need to be separately formed in each pixel, and thus the fabrication process can be simple.

First electrodes 403R, 403G and 403B are disposed in respective unit pixel regions on the first refraction layer 402. The first electrodes 403R, 403G and 403B are transmissive electrodes. An insulating layer 404 defining pixel regions is disposed between the first electrodes 403R, 403G and 403B.

Organic layers 405R, 405G and 405B having red, green and blue emission layers, respectively, are disposed on the first electrodes 403R, 403G and 403B, respectively. The organic layers 405R, 405G and 405B may be formed by vacuum deposition using a fine pitch mask, inkjet printing or laser induced thermal imaging. The organic layers 405R, 405G and 405B may be formed to the same thickness. However, to maximize resonance effect, the organic layer in a unit pixel region emitting light having a longer wavelength is preferably thicker than the organic layer in a unit pixel region emitting light having a shorter wavelength.

Separators 406 may be disposed on the insulating layer 404. Second electrodes 407, each of which is isolated by the separators 406, are disposed on the organic layers 405R, 405G and 405B. The second electrodes 407 are reflective electrodes.

Meanwhile, in the top-emission active-matrix OLED display device, the first electrodes 403R, 403G and 403B are formed as reflective electrodes, and the second electrodes 407 are formed as transmissive electrodes. In addition, the first refraction layer 402 is disposed over the second electrode 407, and the second refraction layer 401 is disposed on the first refraction layer 402.

Moreover, red, green and blue color filters 408R, 408G and 408B may be disposed in the respective unit pixel regions between the substrate 400 and the second refraction layer 401. The color filters 408R, 408G and 408B can further enhance color purity. A black matrix 409 may be disposed between the color filters.

Figure 5:
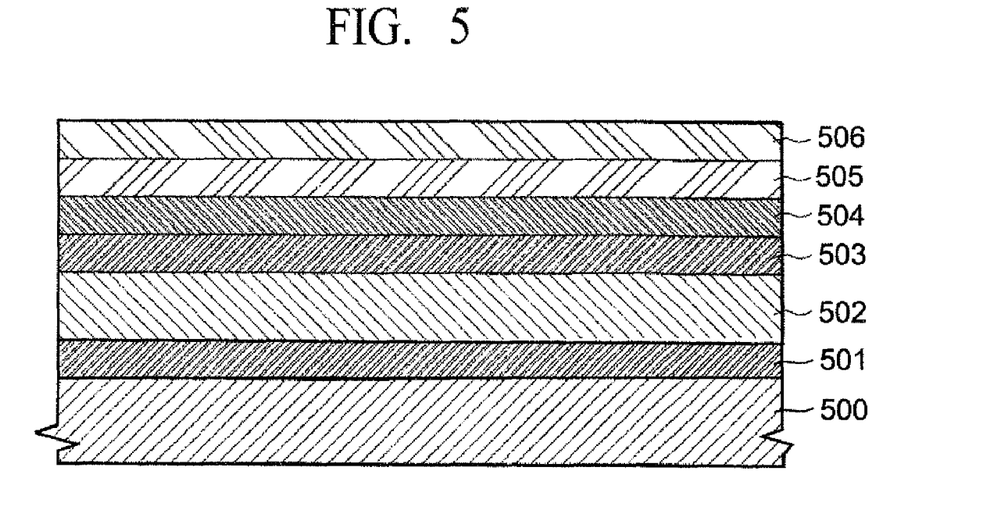
FIG. 5 is a cross-sectional view of an OLED display device according to a fifth exemplary embodiment of the present invention.

Turning now to FIG. 5, FIG. 5 is a cross-sectional view of an OLED display device according to a fifth embodiment of the present invention. The embodiment of FIG. 5 is similar to that of FIG. 1, with the exception that a third reflection layer 501 is included. In the embodiment of FIG. 5, the third reflection layer 501 is arranged between second reflection layer 502 and substrate 500. A first reflection layer 503 is arranged on top of second reflection layer 502, and a first electrode 504, an organic layer 505 and a second electrode 506 are sequentially arranged on the first reflection layer 503. As a result, in the embodiment of FIG. 5, the stack of reflection layers is composed of three reflection layers arranged between substrate 500 and first electrode 504. In the OLED display device of FIG. 5, light is transmitted through substrate 500 to be viewed by a viewer. Although the present invention is in now way so limited, it is often the case that the refraction index, thickness and material of the third reflection layer 501 is the same as that of the first reflection layer 503.

Figure 6:
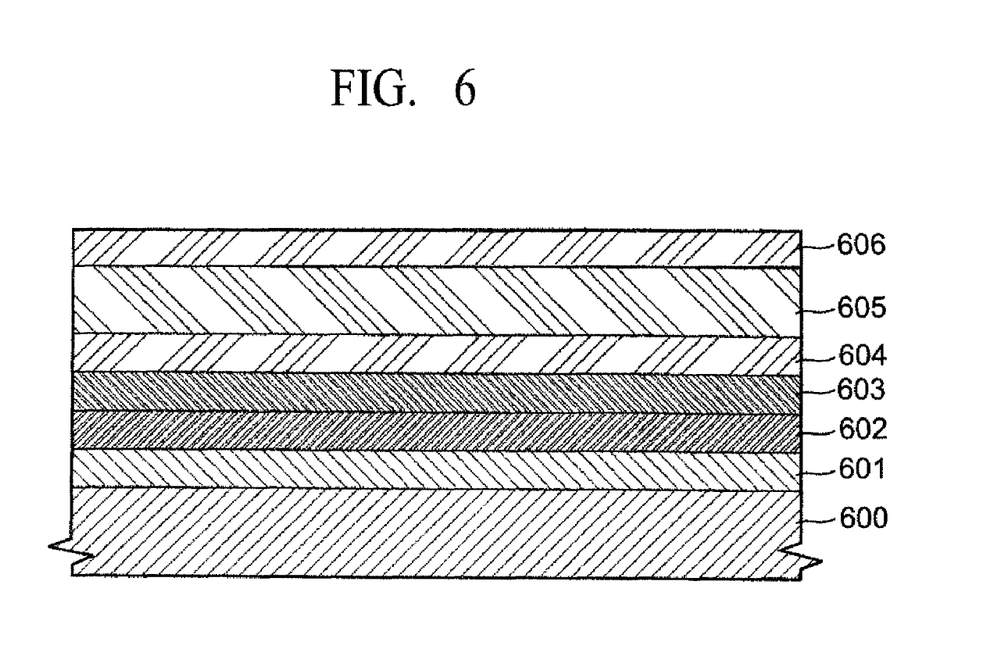
FIG. 6 is a cross-sectional view of an OLED display device according to a sixth exemplary embodiment of the present invention.

Turning now to FIG. 6, FIG. 6 is an OLED display device according to a sixth embodiment of the present invention. The OLED display device of FIG. 6 is similar to that of FIG. 2, with the exception that a third reflection layer 606 is arranged on top of the second reflection layer 605. As a result, the structure of FIG. 6 includes substrate 600, first electrode 601, organic layers 602, second electrode 603, first reflection layer 604, second reflection layer 605 and third reflection layer 606 sequentially arranged on substrate 600. Although the present invention is in no way so limited, it is often that the third reflection layer 606 to have the same refractive index, be of the same thickness and be comprised of the same material as the first reflection layer 604. In the OLED display device FIG. 6, light is transmitted away from the substrate 600 to be viewed by a viewer.

Hereinafter, preferable experimental examples will be described to aid in understanding of the present invention. However, it should be understood that the experimental examples described below are provided to aid in understanding of the present invention, and not to limit the present invention.

Experimental Examples 1 to 4

Sample OLED display devices were fabricated. Second refraction layers ($Nb_2O_5$, refractive index: 2.4) were formed to thicknesses listed in Table 1 on respective glass substrates. A first refraction layer ($SiO_2$, refractive index: 1.45) was formed to a thickness of 30 nm on the second refraction layer. A first electrode, which was made of ITO, was formed to a thickness of 50 nm on the first refraction layer. A hole injection layer was formed to a thickness of 75 nm using DNTPD on the first electrode, and a hole transport layer was formed to a thickness of 15 nm using NPB on the hole injection layer. A blue emission layer was formed to a thickness of 25 nm using AND as a host and EK8 (Kodak) as a dopant on the hole transport layer. Subsequently, an electron transport layer was formed to a thickness of 25 nm using $Alq_3$ on the blue emission layer, and an electron injection layer was formed to a thickness of 5 nm using LiF on the electron transport layer. A second electrode was formed to a thickness of 80 nm using Al on the electron injection layer.

Experimental Examples 5 to 8

Except that a first refraction layer was formed to a thickness of 90 nm, other sample OLED display devices were fabricated with the same conditions as in Experimental examples 1 to 4.

Comparative Example 1

Compared with Experimental example 1, first and second refraction layers were not formed.

Comparative Examples 2 to 5

Except that a first refraction layer was formed to a thickness of 120 nm, the samples were fabricated with the same conditions as in Experimental examples 1 to 4.

Tables 1 and 2 show color coordinates and brightness of the OLED display devices fabricated for Experimental examples 1 to 4 and 5 to 8. Tables 3 and 4 show color coordinates and brightness of the OLED display devices fabricated for Comparative examples 1 and 2 to 5.

TABLE 1

| | Thickness of $Nb_2O_5$ (nm) | x | y | Brightness |
|---|---|---|---|---|
| E. example 1 | 50 | 0.149 | 0.093 | 62.7 |
| E. example 2 | 80 | 0.134 | 0.140 | 89.7 |
| E. example 3 | 180 | 0.134 | 0.145 | 82.3 |
| E. example 4 | 230 | 0.154 | 0.131 | 86.6 |

TABLE 2

| | Thickness of $Nb_2O_5$ (nm) | x | y | Brightness |
|---|---|---|---|---|
| E. example 5 | 50 | 0.124 | 0.141 | 96.5 |
| E. example 6 | 80 | 0.125 | 0.209 | 120.2 |
| E. example 7 | 180 | 0.127 | 0.179 | 111.1 |
| E. example 8 | 230 | 0.137 | 0.142 | 96.6 |

TABLE 3

| | x | Y | Brightness |
|---|---|---|---|
| C. example 1 | 0.145 | 0.202 | 112.5 |

TABLE 4

| | Thickness of $Nb_2O_5$ (nm) | x | y | Brightness |
|---|---|---|---|---|
| C. example 2 | 50 | 0.141 | 0.403 | 153.4 |
| C. example 3 | 80 | 0.165 | 0.268 | 130.9 |
| C. example 4 | 180 | 0.137 | 0.263 | 137.6 |
| C. example 5 | 230 | 0.140 | 0.344 | 134.8 |

Referring to Tables 1 to 4, in Experimental examples 1 to 4 and 5 to 8, comparing the first refraction layers having thicknesses of 30 nm and 90 nm, the brightness was slightly decreased at 30 nm, but the y value of the color coordinates was significantly decreased compared to Comparative example 1, or there was no significant difference in y value and the brightness was increased. For blue, although the brightness was slightly decreased, the color reproducibility was increased as the y value is decreased. Therefore, when the first refraction layer was formed to a thickness of 100 nm or less, the color reproducibility and the light extraction efficiency were increased. On the other hand, in Comparative examples 2 to 5, when the second refraction layer was formed to a thickness of 120 nm, the brightness was increased, but the y value of the color coordinates was significantly increased compared to Comparative example 1. Thus, the increase in y value has a bad influence on the color reproducibility in spite of the increase in brightness.

Experimental Examples 9 to 20

Second refraction layers ($Nb_2O_5$, refractive index: 2.4) were formed to thicknesses listed in Table 5 on respective glass substrates. A first refraction layer ($SiO_2$, refractive index: 1.45) was formed to a thickness of 30 nm on the second refraction layer. The first electrode was formed to a thickness of 50 nm using ITO on the first refraction layer. Hole injection layers were formed to thicknesses of 145, 100 and 75 nm for red, green and blue pixels using DNTPD on the first electrode, respectively. A hole transport layer was formed to a thickness of 15 nm using NPB on the hole injection layers. A red emission layer was formed to a thickness of 45 nm using rubrene as a host and RD3 (Kodak) as a dopant, a green emission layer was formed to a thickness of 45 nm using $Alq_3$ as a host and C545T as a dopant, and a blue emission layer was formed to a thickness of 25 nm using AND as a host and EK8 (Kodak) as a dopant on the hole transport layer. Subsequently, an electron transport layer was formed to a thickness of 25 nm using $Alq_3$ on the emission layers, and an electron injection layer was formed to a thickness of 5 nm using LiF on the electron transport layer. A second electrode was formed to a thickness of 80 nm using Al on the electron injection layer.

Experimental Examples 21 to 32

Except that $Ta_2O_5$ having a refractive index of 2.1 as a second refraction layer was used, the experiments were performed under the same conditions as in Experimental examples 9 to 20.

Experimental Examples 33 to 44

Except that $TiO_2$ having a refractive index of 2.3 as a second refraction layer was used, the experiments were performed under the same conditions as in Experimental examples 9 to 20.

Experimental Examples 45 to 50

Except that SiN having a refractive index of 1.8 as a second refraction layer was formed to a thickness listed in Table 8, the experiments were performed under the same conditions as in Experimental example 9.

Comparative Example 6

Except that first and second refraction layers were not formed, the experiment was performed under the same conditions as in Experimental example 9.

Tables 5 to 8 show color coordinates and brightness for red, green and blue light in the OLED display devices according to Experimental examples 9 to 50. Table 9 shows color coordinates and brightness for red, green and blue light in the OLED display device according to Comparative example 6.

TABLE 5

| | Thickness of $Nb_2O_5$ (nm) | Red | | | Green | | | blue | | |
|---|---|---|---|---|---|---|---|---|---|---|
| | | x | y | Brightness | x | y | Brightness | x | y | Brightness |
| E. example 9 | 20 | 0.662 | 0.338 | 131.2 | 0.265 | 0.671 | 132.2 | 0.145 | 0.124 | 87.8 |
| E. example 10 | 50 | 0.661 | 0.339 | 204.8 | 0.264 | 0.693 | 177.5 | 0.129 | 0.131 | 95.4 |
| E. example 11 | 80 | 0.670 | 0.329 | 195.5 | 0.328 | 0.642 | 159.9 | 0.123 | 0.213 | 124.4 |
| E. example 12 | 100 | 0.673 | 0.327 | 148.3 | 0.342 | 0.619 | 135.0 | 0.141 | 0.187 | 121.0 |
| E. example 13 | 120 | 0.670 | 0.333 | 122.4 | 0.302 | 0.641 | 130.3 | 0.147 | 0.132 | 101.1 |
| E. example 14 | 150 | 0.660 | 0.340 | 139.7 | 0.256 | 0.695 | 162.6 | 0.129 | 0.144 | 95.0 |

TABLE 5-continued

| | Thickness of $Nb_2O_5$ | Red | | | Green | | | blue | | |
|---|---|---|---|---|---|---|---|---|---|---|
| | (nm) | x | y | Brightness | x | y | Brightness | x | y | Brightness |
| E. example 15 | 180 | 0.661 | 0.338 | 207.2 | 0.300 | 0.667 | 162.8 | 0.125 | 0.188 | 113.8 |
| E. example 16 | 200 | 0.668 | 0.332 | 204.5 | 0.329 | 0.635 | 147.7 | 0.138 | 0.166 | 118.7 |
| E. example 17 | 230 | 0.673 | 0.327 | 143.8 | 0.306 | 0.640 | 140.2 | 0.141 | 0.145 | 102.8 |
| E. example 18 | 270 | 0.662 | 0.338 | 133.3 | 0.273 | 0.686 | 160.5 | 0.129 | 0.168 | 103.6 |
| E. example 19 | 300 | 0.660 | 0.340 | 192.4 | 0.308 | 0.656 | 151.8 | 0.135 | 0.157 | 114.3 |
| E. example 20 | 350 | 0.673 | 0.327 | 155.8 | 0.292 | 0.658 | 151.6 | 0.135 | 0.162 | 102.1 |

TABLE 6

| | Thickness of $Nb_2O_5$ | Red | | | Green | | | blue | | |
|---|---|---|---|---|---|---|---|---|---|---|
| | (nm) | x | y | Brightness | x | y | Brightness | x | y | Brightness |
| E. example 21 | 20 | 0.664 | 0.336 | 124.4 | 0.286 | 0.656 | 124.7 | 0.145 | 0.152 | 97.1 |
| E. example 22 | 50 | 0.662 | 0.338 | 165.8 | 0.269 | 0.680 | 157.7 | 0.135 | 0.135 | 97.6 |
| E. example 23 | 80 | 0.667 | 0.333 | 186.0 | 0.310 | 0.655 | 159.5 | 0.126 | 0.193 | 118.0 |
| E. example 24 | 100 | 0.670 | 0.329 | 162.1 | 0.334 | 0.631 | 142.7 | 0.132 | 0.215 | 124.8 |
| E. example 25 | 120 | 0.667 | 0.333 | 119.2 | 0.334 | 0.623 | 127.5 | 0.144 | 0.185 | 117.2 |
| E. example 26 | 150 | 0.661 | 0.338 | 142.1 | 0.288 | 0.655 | 132.2 | 0.144 | 0.140 | 100.8 |
| E. example 27 | 180 | 0.662 | 0.338 | 171.0 | 0.274 | 0.680 | 154.3 | 0.130 | 0.165 | 103.8 |
| E. example 28 | 200 | 0.668 | 0.332 | 179.2 | 0.295 | 0.667 | 155.7 | 0.127 | 0.193 | 112.7 |
| E. example 29 | 230 | 0.673 | 0.327 | 143.8 | 0.328 | 0.634 | 140.7 | 0.138 | 0.181 | 118.7 |
| E. example 30 | 270 | 0.671 | 0.329 | 131.9 | 0.305 | 0.641 | 134.0 | 0.141 | 0.155 | 105.9 |
| E. example 31 | 300 | 0.666 | 0.334 | 122.6 | 0.279 | 0.673 | 148.3 | 0.133 | 0.175 | 105.0 |
| E. example 32 | 350 | 0.662 | 0.338 | 174.1 | 0.315 | 0.646 | 142.8 | 0.138 | 0.168 | 115.7 |

TABLE 7

| | Thickness of $TiO_2$ | Red | | | Green | | | blue | | |
|---|---|---|---|---|---|---|---|---|---|---|
| | (nm) | x | y | Brightness | x | y | Brightness | x | y | Brightness |
| E. example 33 | 20 | 0.662 | 0.338 | 129.2 | 0.270 | 0.667 | 130.4 | 0.145 | 0.129 | 90.0 |
| E. example 34 | 50 | 0.661 | 0.339 | 193.8 | 0.264 | 0.691 | 173.6 | 0.130 | 0.131 | 95.9 |
| E. example 35 | 80 | 0.669 | 0.330 | 195.9 | 0.324 | 0.646 | 160.7 | 0.123 | 0.210 | 123.0 |
| E. example 36 | 100 | 0.673 | 0.327 | 153.2 | 0.342 | 0.621 | 137.1 | 0.139 | 0.194 | 122.9 |
| E. example 37 | 120 | 0.671 | 0.329 | 125.0 | 0.313 | 0.633 | 128.2 | 0.147 | 0.141 | 105.6 |
| E. example 38 | 150 | 0.662 | 0.338 | 130.4 | 0.259 | 0.688 | 155.8 | 0.133 | 0.142 | 94.3 |
| E. example 39 | 180 | 0.660 | 0.340 | 188.9 | 0.291 | 0.672 | 163.2 | 0.124 | 0.187 | 111.1 |
| E. example 40 | 200 | 0.666 | 0.334 | 205.3 | 0.322 | 0.644 | 150.9 | 0.135 | 0.174 | 118.8 |
| E. example 41 | 230 | 0.673 | 0.327 | 155.9 | 0.319 | 0.630 | 137.1 | 0.142 | 0.149 | 107.9 |
| E. example 42 | 270 | 0.666 | 0.334 | 124.9 | 0.272 | 0.683 | 156.9 | 0.130 | 0.167 | 102.0 |
| E. example 43 | 300 | 0.659 | 0.341 | 165.2 | 0.298 | 0.666 | 153.7 | 0.134 | 0.160 | 112.7 |
| E. example 44 | 350 | 0.671 | 0.329 | 175.3 | 0.305 | 0.644 | 145.6 | 0.136 | 0.165 | 105.2 |

TABLE 8

| | Thickness of SiN | Red | | | Green | | | Blue | | |
|---|---|---|---|---|---|---|---|---|---|---|
| | (nm) | x | y | Brightness | x | y | Brightness | x | y | Brightness |
| E. example 45 | 50 | 0.664 | 0.336 | 141.1 | 0.285 | 0.663 | 139.1 | 0.140 | 0.152 | 102.1 |
| E. example 46 | 100 | 0.668 | 0.320 | 155.8 | 0.320 | 0.641 | 141.9 | 0.133 | 0.206 | 102.7 |
| E. example 47 | 150 | 0.669 | 0.331 | 121.6 | 0.320 | 0.631 | 121.9 | 0.146 | 0.176 | 111.6 |
| E. example 48 | 200 | 0.664 | 0.336 | 129.7 | 0.287 | 0.664 | 139.9 | 0.136 | 0.171 | 107.2 |
| E. example 49 | 300 | 0.670 | 0.330 | 130.4 | 0.317 | 0.633 | 126.3 | 0.144 | 0.168 | 110.7 |
| E. example 50 | 350 | 0.665 | 0.335 | 123.0 | 0.292 | 0.662 | 139.2 | 0.135 | 0.188 | 110.1 |

TABLE 9

| | red | | | Green | | | Blue | |
|---|---|---|---|---|---|---|---|---|
| x | Y | Brightness | X | Y | Brightness | x | Y | Brightness |
| 0.667 | 0.334 | 114.2 | 0.317 | 0.635 | 115.3 | 0.145 | 0.202 | 112.5 |

Referring to Tables 5 to 9, in Experimental examples 9 to 50, when the thickness of the first refraction layer was fixed to 60 nm, and the thickness of the second refraction layer was changed within a range greater than 0 to not exceeding 350 nm, the brightness of red and green light was increased in every range as compared with Comparative example 6, and the brightness of blue light was decreased in y value of color coordinates or increased in brightness. Particularly, when the second refraction layer was formed to a thickness of 20 to 100 nm or 150 to 350 nm, and preferably 50 to 80 nm or 180 to 200 nm, the increase in brightness was greater than that in other ranges of thickness.

As described above, when the first refraction layer, a low refraction layer, is formed to a thickness of 100 nm or less, the light extraction efficiency and color reproducibility can be improved. In addition, when the second refraction layer, a high refraction layer, is formed to a thickness greater than 0 and not exceeding 350 nm, preferably 20 to 100 nm or 150 to 350 nm, and more particularly 50 to 80 nm or 180 to 200 nm, and even formed to the same thickness as the first refraction layer, an OLED display device can have enhanced light extraction efficiency and color coordinates, and thus can have improved color reproducibility with respect to red, green and blue light having a wavelength range from 400 to 800 nm.

According to the present invention, as thicknesses of first and second refraction layers disposed between an electrode and a transparent substrate are controlled, an OLED display device can have improved brightness and color coordinate characteristics in all emission wavelength ranges using a simple structure and process and thus enhanced light extraction efficiency and color reproducibility.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting diode (OLED) display device, comprising:
   a substrate;
   a first electrode disposed on the substrate;
   an organic layer disposed on the first electrode and including an emission layer;
   a second electrode disposed on the organic layer; and
   a stack of first, second and third refraction layers being arranged either between the first electrode and the substrate or on the second electrode, the third refraction layer being arranged either between the second refraction layer and the substrate when the stack is arranged between the first electrode and the substrate or arranged on the second refraction layer when the stack is arranged on the second electrode, a refractive index of the first refraction layer being smaller than a refractive index of the second refraction layer, a thickness of the first refraction layer being no greater than 100 nm, a refractive index of the third refraction layer being the same as the refractive index of the first refraction layer, the OLED display device being composed of only three refraction layers.

2. The OLED display device according to claim 1, wherein a thickness of the second refraction layer is no greater than 350 nm.

3. The OLED display device according to claim 2, wherein the thickness of the second refraction layer is either 20 nm to 100 nm or 150 nm to 350 nm.

4. The OLED display device according to claim 3, wherein the thickness of the second refraction layer is either 50 nm to 80 nm or 180 nm to 200 nm.

5. The OLED display device according to claim 1, wherein the refractive index of the second refraction layer is 1.1 times greater than the refractive index of the first refraction layer.

6. The OLED display device according to claim 1, wherein the refractive index of the first refraction layer is smaller than a refractive index of the first electrode if the stack of the first and second refraction layers is disposed between the first electrode and the substrate, and the refractive index of the first refraction layer is smaller than a refractive index of the second electrode if the stack of the first and second refraction layers is disposed on the second electrode.

7. The OLED display device according to claim 1, wherein the refractive index of the first refraction layer is in the range of 1.4 to less than 1.8.

8. The OLED display device according to claim 1, wherein each of the first and second refraction layers is comprised of a material selected from a group consisting of niobium oxide ($Nb_2O_5$), tantalum oxide ($Ta_2O_5$), titanium oxide ($Ti_2O_5$), silicon nitride ($Si_xN_y$), silicon oxide ($SiO_2$), antimony oxide ($Sb_2O_3$), aluminum oxide ($Al_2O_3$), zirconium oxide ($ZrO_2$), magnesium oxide (MgO), Hafnium oxide ($HfO_2$) and synthetic polymer.

9. The OLED display device according to claim 1, wherein a thickness of the third refraction layer is the same as the thickness of the first refraction layer.

10. The OLED display device according to claim 1, wherein the first electrode is a transmissive electrode, the second electrode is a reflective electrode, the first refraction layer is disposed between the first electrode and the substrate, and the second refraction layer is disposed between the first refraction layer and the substrate.

11. The OLED display device according to claim 1, wherein the first electrode is a reflective electrode, the second electrode is a transmissive electrode, the first refraction layer is disposed on the second electrode, and the second refraction layer is disposed on the first refraction layer.

12. An organic light emitting diode (OLED) display device, comprising:
   a substrate including a plurality of unit pixel regions;
   a plurality of organic light emitting diodes disposed on the unit pixel regions of the substrate, each of the organic light emitting diodes including:
      a first electrode,
      a second electrode; and
      an organic layer disposed between the first and the second electrodes, the organic layer having an emission layer; and
   a stack composed of a first refraction layer, a second refraction layer and a third refraction layer, the stack being disposed either between the first electrode of each of the organic light emitting diodes and the substrate or on the second electrode of each of the organic light emitting diodes, the third refraction layer being disposed either between the second refraction layer and the substrate when the stack is disposed between the first electrode and the substrate or on the second refraction layer when the stack is disposed on the second electrode, a refractive index of the first refraction layer being smaller than a refractive index of the second refraction layer, a thickness of the first refraction layer being no greater than 100 nm, a refractive index of the third refraction layer being the same as the refractive index of the first refraction layer, wherein the first refraction layer of each of the organic light emitting diodes and the second refraction layer of the each of the organic light emitting diodes have substantially the same thicknesses.

13. The OLED display device according to claim 12, wherein the second refraction layer is formed to have a thickness not exceeding 350 nm.

14. The OLED display device according to claim 13, wherein the second refraction layer is formed to have a thickness of either 20 nm to 100 nm or 150 nm to 350 nm.

15. The OLED display device according to claim 14, wherein the second refraction layer is formed to have a thickness of either 50 nm to 80 nm or 180 nm to 200 nm.

16. The OLED display device according to claim 12, wherein one of the organic layers emitting light having a longer wavelength is thicker than another of the organic layers emitting light having a shorter wavelength.

17. The OLED display device according to claim 12, wherein the refractive index of the second refraction layer is 1.1 times greater than the refractive index of the first refraction layer.

18. The OLED display device according to claim 12, wherein the refractive index of the first refraction layer is smaller than a refractive index of the first electrode if the stack of the first and second refraction layers is disposed between the first electrode and the substrate, and the refractive index of the first refraction layer is smaller than a refractive index of the second electrode if the stack of the first and second refraction layers is disposed on the second electrode.

19. The OLED display device according to claim 12, wherein the refractive index of the first refraction layer is in the range of 1.4 to less than 1.8.

20. The OLED display device according to claim 12, wherein each of the first and second refraction layers is comprised of a material selected from a group consisting of niobium oxide ($Nb_2O_5$), tantalum oxide ($Ta_2O_5$), titanium oxide ($Ti_2O_5$), silicon nitride ($Si_xN_y$), silicon oxide ($SiO_2$), antimony oxide ($Sb_2O_3$), aluminum oxide ($Al_2O_3$), zirconium oxide ($ZrO_2$), magnesium oxide (MgO), Hafnium oxide ($HfO_2$) and synthetic polymer.

21. The OLED display device according to claim 12, wherein the first electrode is a transmissive electrode, the second electrode is a reflective electrode, the first refraction layer is disposed between the first electrode and the substrate, and the second refraction layer is disposed between the first refraction layer and the substrate.

22. The OLED display device according to claim 12, further comprising:
    a plurality of color filters arranged between the second refraction layer and the substrate; and
    a black matrix arranged between the second refraction layer and the substrate and between adjacent ones of the color filters, the stack of the first and second refraction layers being arranged between the first electrode and the substrate.

23. The OLED display device according to claim 12, further comprising a color filter arranged on the stack when the stack is arranged on the second electrode.

* * * * *